US012298366B2

United States Patent
Karousos et al.

(10) Patent No.: US 12,298,366 B2
(45) Date of Patent: May 13, 2025

(54) MAGNETIC-BASED DETERMINATION OF SORPTION SEPARATION FACTOR FOR BINARY GAS MIXTURES

(71) Applicant: Khalifa University of Science and Technology, Abu Dhabi (AE)

(72) Inventors: Dionysios Karousos, Attica (GR); Andreas Sapalidis, Attica (GR); Georgios Karanikolos, Abu Dhabi (AE); Evangelos Favvas, Attica (GR)

(73) Assignee: Khalifa University of Science and Technology, Abu Dhabi (AE)

( * ) Notice: Subject to any disclaimer, the term of this patent is extended or adjusted under 35 U.S.C. 154(b) by 315 days.

(21) Appl. No.: 18/021,004

(22) PCT Filed: Sep. 2, 2021

(86) PCT No.: PCT/IB2021/058039
§ 371 (c)(1),
(2) Date: Feb. 13, 2023

(87) PCT Pub. No.: WO2022/058831
PCT Pub. Date: Mar. 24, 2022

(65) Prior Publication Data
US 2023/0296704 A1  Sep. 21, 2023

Related U.S. Application Data

(60) Provisional application No. 63/078,364, filed on Sep. 15, 2020.

(51) Int. Cl.
*G01R 33/16* (2006.01)
*B01D 53/04* (2006.01)

(52) U.S. Cl.
CPC ......... *G01R 33/16* (2013.01); *B01D 53/0454* (2013.01)

(58) Field of Classification Search
None
See application file for complete search history.

(56) References Cited

U.S. PATENT DOCUMENTS 3,504,274 A  3/1970 Eller et al.
3,879,658 A  4/1975 Hummel
(Continued)

FOREIGN PATENT DOCUMENTS

CN  104136905 A  11/2014
DE  102013015342 A1  4/2015
EP  0514759 A2  11/1992

OTHER PUBLICATIONS

"International Search Report and Written Opinion Received mailed Nov. 17, 2021", 9 pages for PCT Application No. PCT/IB2021/058039.

(Continued)

*Primary Examiner* — Clayton E. LaBalle
*Assistant Examiner* — Diana Hancock
(74) *Attorney, Agent, or Firm* — Billion & Armitage (57) ABSTRACT

Embodiments include methods (and related systems, devices, and apparatuses) for determining a sorption separation factor for a binary gas mixture by applying a magnetic field to at least a portion of a sorbent (604) disposed in a chamber of a magnetic susceptibility device; directing a first gas stream including a first gas compound into the chamber at a first pressure and temperature to obtain a first magnetic susceptibility measurement; directing a second gas stream (Continued)

including a second gas compound into the chamber at a second pressure and temperature to obtain a second magnetic susceptibility measurement; directing a binary gas mixture including the first gas compound and the second gas compound into the chamber at a third pressure and temperature to obtain a third magnetic susceptibility measurement; and determining a sorption separation factor based on the first, the second, and the third magnetic susceptibility measurements.

20 Claims, 6 Drawing Sheets

(56) References Cited

U.S. PATENT DOCUMENTS

| | | | |
|---|---|---|---|
| 6,981,426 B2 | 1/2006 | Wang et al. | |
| 11,666,855 B2* | 6/2023 | Karanikolos | B01D 71/64 95/28 |
| 2021/0220827 A1* | 7/2021 | Spero | B01L 3/502753 |

OTHER PUBLICATIONS

Bazan, R. E., et al., "Adsorption equilibria of O 2, Ar, Kr and Xe on activated carbon and zeolites: single component and mixture data", Adsorption 17 (2011): 371-383.

Burress, Jacob, et al., "Combination volumetric and gravimetric sorption instrument for high accuracy easurements of methane adsorption", Review of Scientific Instruments 88.5 (2017).

Kawamura, Kiyoshi, et al., "Magnetic susceptibility of oxygen adsorbed on the surface of spherical and fibrous activated carbon", Applied Science Innovations Pvt. Ltd., India; Carbon—Sci. Tech. 2 (2009) 73-77.

Pino, David, et al., "Experimental determination of the adsorption isotherms in gas mixtures under extended ressure and temperature range: Application to the CO 2-CH 4 binary mixture", Journal of Thermal Analysis and alorimetry 117 (2014): 1469-1477.

Tamnanloo, Javad, et al., "Binary equilibrium adsorption data and comparison of zeolites with activated carbon for selective adsorption of CO2 from CH4", Adsorption Science & Technology 32.9 (2014): 707-716.

* cited by examiner

MAGNETIC-BASED DETERMINATION OF SORPTION SEPARATION FACTOR FOR BINARY GAS MIXTURES

BACKGROUND

An ongoing challenge for industrial gas separation processes based on gas adsorption from gas mixtures, such as pressure swing adsorption (PSA), temperature swing adsorption (TSA), and vacuum swing adsorption (VSA), among others, includes achieving efficient selective adsorption of one gaseous compound. In a typical gas separation process, gas compounds compete with each other for adsorption sites. This competitive adsorption prevents these gas separations processes from achieving 100% efficiency because one or more undesirable gaseous compound(s) is also adsorbed to the adsorbent. Accordingly, gas adsorption selectivity of desirable compounds over undesirable compounds is a basic parameter used to characterize adsorbent materials being considered for use in said industrial gas separation processes. Conventional state of the art gravimetric and volumetric methods for the accurate measurement of adsorption isotherms of various gases on adsorbent samples are the current standard for characterizing and comparing adsorbents.

However, volumetric or gravimetric high precision devices, or combinations of volumetric-gravimetric methods are designed for determining adsorption isotherms of a single gas to a sample of adsorbent material and not for the determination of adsorption selectivity for a sample in equilibrium with a gas mixture. Therefore, the gas adsorption selectivity, which is also referred to as a gas separation factor, of a sample is usually estimated in terms of a theoretical or ideal gas adsorption selectivity. Instead of using the actual adsorbed gas amounts to determine gas adsorption selectivity, said gas adsorption selectivity is estimated based on adsorbed gas amounts that correspond to single gas adsorption at the same pressure and/or temperature. In other words, gas adsorption selectivity is estimated using adsorption isotherms for each pure gas, and the actual adsorbed gas amounts for a gas mixture is not utilized in that determination. The problem with this approach is that the ratio of real molar fractions that two gas mixture compounds would have in the real adsorbed phase, practically never coincides with the theoretical ratio due to competitive adsorption.

There are techniques for determining the real gas adsorption selectivity. A typical example is the indirect technique of gas-mixture sampling from a closed, gas-tight chamber, where adsorption of a gas mixture to an adsorbent occurs and where equilibrium adsorption may be reached. Gas sampling is performed with a gas-sampling syringe through a septum and the composition of the sample (e.g., of the gas that remains above the adsorbent after adsorption) is determined by gas chromatography. The fractions of adsorbed gases are then calculated through mass balances. The same basic principle can also be applied under continuous flow, by determination of adsorbed gas amounts in a fixed-bed adsorption column, through measurement of gas amounts breaking through the column by means of gas analyzers. While these techniques may be used to determine the real gas adsorption selectivity, they require long measurement times and highly expensive instrumentation, among other drawbacks.

SUMMARY

According to one or more aspects of the invention, a method of determining a sorption separation factor for a binary gas mixture is provided. The method may include one or more of the following steps: applying a magnetic field to at least a portion of a sorbent disposed in a chamber of a magnetic susceptibility device; directing a first gas compound stream including a first gas compound into the chamber at a first pressure and a first temperature to obtain a first magnetic susceptibility measurement; directing a second gas stream including a second gas compound into the chamber at a second pressure and a second temperature to obtain a second magnetic susceptibility measurement; directing a binary gas mixture including the first gas compound and the second gas compound into the chamber at a third pressure and a third temperature to obtain a third magnetic susceptibility measurement; and determining a sorption separation factor based on the first magnetic susceptibility measurement, the second magnetic susceptibility measurement, and the third magnetic susceptibility measurement.

According to one or more further aspects of the invention, a method of determining a gas adsorption separation factor for a binary gas mixture is provided. The method may include one or more of the following steps: applying a magnetic field to at least a portion of an adsorbent material disposed in a chamber of an apparatus for measuring magnetic susceptibility; directing a first gas stream including a first gas compound into the chamber at a first pressure and a first temperature to obtain a first magnetic susceptibility measurement; directing a second gas stream including a second gas compound into the chamber at a second pressure and a second temperature to obtain a second magnetic susceptibility measurement; directing a binary gas mixture including the first gas compound and the second gas compound into the chamber at a third pressure and a third temperature to obtain a third magnetic susceptibility measurement; and determining a gas adsorption separation factor based on the first magnetic susceptibility measurement, the second magnetic susceptibility measurement, and the third magnetic susceptibility measurement.

According to one or more further aspects of the invention, a method of determining a gas absorption separation factor for a binary gas mixture is provided. The method may include one or more of the following steps: applying a magnetic field to at least a portion of an absorbent disposed in a chamber of an apparatus for measuring magnetic susceptibility; directing a first gas stream including a first gas compound into the chamber at a first pressure and a first temperature to obtain a first magnetic susceptibility measurement; directing a second gas stream including a second gas compound into the chamber at a second pressure and a second temperature to obtain a second magnetic susceptibility measurement; directing a binary gas mixture including the first gas compound and the second gas compound into the chamber at a third pressure and a third temperature to obtain a third magnetic susceptibility measurement; and determining a gas absorption separation factor based on the first magnetic susceptibility measurement, the second magnetic susceptibility measurement, and the third magnetic susceptibility measurement.

According to one or more further aspects of the invention, an apparatus for determining a sorption separation factor for a binary gas mixture in accordance with the methods disclosed herein is provided.

According to one or more further aspects of the invention, a system for determining the sorption separation factor for a binary gas mixture in accordance with the methods disclosed herein is provided. In some embodiments, the system includes a sorbent, a balance for measuring the magnetic susceptibility of the sorbent, a flow cell, at least one pair of magnets disposed about the sorbent in the flow cell, a gas inlet in fluid communication with the sorbent in the flow cell, and a gas outlet in fluid communication with the sorbent in the flow cell. The sorbent can be contained within the flow cell, while the magnets can be configured to produce a magnetic field around the sorbent in the flow cell. In further embodiments, the system includes at least one valve configured to control the pressure of a gas within the flow cell and/or a heater to control the temperature of a gas in the flow cell. In even further embodiments, the system can also include a rod attached to the balance, where movement by the balance cause the rod to move as well. The system may also include at least one optical sensor that is configured to detect movement by the rod.

DETAILED DESCRIPTION

Discussion

In general, the separation factor of gas adsorption and/or gas absorption may be defined as the ratio of (A) a molar fraction of two gas compounds in a sorbed phase, which may be an adsorbed phase and/or an absorbed phase, to (B) a molar fraction of said gas compounds in a gaseous phase (which may be in contact with the sorbed phase), which may be a non-adsorbed phase and/or a non-absorbed phase. For example, the separation factor, or real selectivity of gas sorption (e.g., gas adsorption and/or gas absorption), may be given by equation (3) below:

$$\text{Selectivity} = \frac{\frac{x_1}{x_2}}{\frac{y_1}{y_2}} \quad (3)$$

where $x_1$ and $x_2$ are the molar fractions of a first gas compound and a second gas compound in the sorbed phase (e.g., an adsorbed phase and/or an absorbed phase), respectively; and where $y_1$ and $y_2$ are the molar fractions of the first gas compound and the second gas compound in the gaseous phase (which may be in contact with the sorbed phase), respectively. Accordingly, to determine the separation factor of gas sorption, the molar fractions of the first gas compound and the second gas compound in the adsorbed phase and/or absorbed phase must be known.

According to conventional devices and methods, the actual amount of gas compounds adsorbed and/or absorbed by an adsorbent and/or an absorbent must be calculated either directly by desorption and sensing, or indirectly by sensing the remaining non-adsorbed amount of gas. This latter method is the most commonly applied method and is commonly referred to as the chromatographic technique if the gas mixture is fed to a packed bed column of adsorbent under continuous flow. Conventional devices based on the chromatographic technique for determining adsorbed amounts from multicomponent gas mixtures under continuous flow include selective adsorption analyzers. The basic concept of these types of instruments is calculation of adsorbed gas amounts through breakthrough analysis i.e., through calculations involving the area above the sensed gas concentration versus time curves of the gases exiting (e.g., breaking through) the adsorbent column. Since gas concentration has to be continuously monitored at the exit of the adsorbent column, in order to provide "breakthrough curves" which are required for calculations, a tradeoff between two options emerges.

In a first option, gas sensing with a gas chromatographer may be used, but the amount adsorbed or absorbed must be high in order to provide long breakthrough times and slowly evolving sigmoidal breakthrough curves, so that gas chromatography sampling can provide enough points for a proper recording of the breakthrough curves. In this option, measurement times are long and time consuming, especially, for example, when the adsorbate has a low concentration in the feed stream and the device setup is complex and includes a multitude of components. In a second option, gas sensing with gas analyzers for each gas can be used. This approach requires small adsorbent amounts in the column since continuous gas concentration monitoring at column exit allows short breakthrough times. The shortcomings of this option include that the device-setup is expensive and restrictive as a different gas analyzer for each measured gas must be used.

The present invention relates to magnetic susceptibility measuring devices, systems, and methods with general applicability to the field of gas adsorbent characterization and related methods. The present invention overcomes the aforementioned challenges, among others, by providing simple, time-efficient, and low-cost methods and systems for determining the separation factor (e.g., the real (or actual) selectivity) for sorption-based gas separations involving binary gas mixtures. The systems and methods do not require large complex devices and/or apparatuses to determine the separation factor of binary gas mixtures. For example, the magnetic susceptibility measuring systems and methods may utilize modified commercially available devices (e.g., devices designed for the measurement of a material property, other than adsorption efficiency) for determining gas sorption separation factors using magnetic susceptibility measurements. The systems and methods provide quick measurements for detection of gases present in very low amounts (e.g., trace levels) in gas streams. The magnetic susceptibility measuring systems and methods may be applied to characterize and compare novel synthesized gas adsorbing materials for various gas separation applications including, for example and without limitation, purification of $H_2S$, $SO_2$, $NO_x$ (e.g., NO, $NO_2$, etc.), $CH_4$, $O_2$, and $N_2$. The magnetic susceptibility measuring systems and methods may be applied to determine adsorption separation factors in the case of various binary gas mixtures and sorbents. In addition, said devices may be applied under various conditions of pressure, temperature, gas mixture, and adsorbent sample types.

Figure 1:
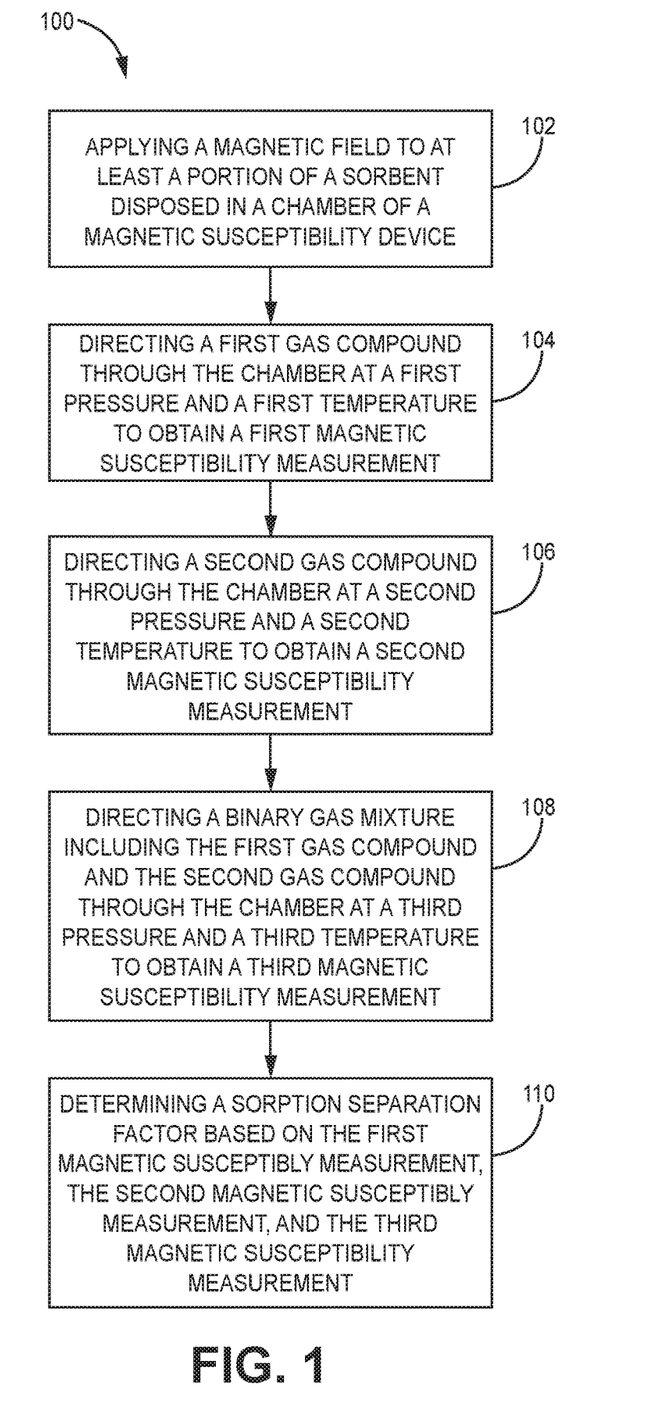
FIG. 1 is a flowchart of a method of determining a sorption separation factor for a binary gas mixture, according to one or more embodiments of the present disclosure.

FIG. 1 is a flowchart of a method of determining a sorption separation factor for a binary gas mixture, according to one or more embodiments of the present disclosure. As shown in FIG. 1, the method may include one or more of the following steps: applying 102 a magnetic field to at least a portion of a sorbent disposed in a chamber (e.g., flow cell) of a magnetic susceptibility device; directing 104 a first gas stream including a first gas compound into the chamber (e.g., flow cell) at a first pressure and a first temperature to obtain a first magnetic susceptibility measurement; directing 106 a second gas stream including a second gas compound into the chamber (e.g., flow cell) at a second pressure and a second temperature to obtain a second magnetic susceptibility measurement; directing 108 a binary gas mixture including the first gas compound and the second gas compound into the chamber (e.g., flow cell) at a third pressure (e.g., which may be the sum of the first two pressures) and a third temperature (e.g., all temperatures during measurements may be the same and/or precisely controlled) to obtain a third magnetic susceptibility measurement; and determining 110 a sorption separation factor based on the first magnetic susceptibility measurement, the second magnetic susceptibility measurement, and the third magnetic susceptibility measurement.

In step 102, a magnetic field is applied to at least a portion of a sorbent disposed in a chamber of a magnetic susceptibility device. In some embodiments, the magnetic field includes an inhomogeneous magnetic field (i.e., a magnetic field that lacks homogeneity or a magnetic field that is not uniform) and the inhomogeneous magnetic field is applied to at least a portion of the sorbent disposed in the chamber of the magnetic susceptibility device. The strength of the magnetic field may range from about 0.01 T to about 50 T, or any incremental value or subrange between that range. For example, in some embodiments, the magnetic field strength may be about 0.6 T. The magnetic field may be switchably turned on and/or turned off. For example, in some embodiments, the magnetic field is continuously applied during one or more of the steps 102 through 110. For example, the magnetic field may be kept on between one or more of the steps 102 through 110. In some embodiments, the magnetic field is intermittently applied during one or more of the steps 102 through 110. For example, the magnetic field may be turned off between one or more of the steps 102 through 110. The sorbent may include one or more of a gas-adsorbing material and a gas-absorbing material. For example, in some embodiments, the sorbent includes an adsorbent, or an adsorbent material. In some embodiments, the sorbent includes an absorbent, or an absorbent material. In some embodiments, the terms adsorption, adsorbate, and adsorbent correspond to sorption onto the surface of a solid material. In some embodiments, the terms absorption, absorbate, and absorbent correspond to respective sorption into the bulk phase of a liquid. In some embodiments, the terms sorption, sorbate, sorbent correspond broadly to both of adsorption, adsorbate, and adsorbent, and absorption, absorbate, and absorbent, respectively. The sorbent may be positioned or located such that it is at least partially within the magnetic field when said magnetic field is applied or turned on.

In step 104, the first gas stream including the first gas compound is directed into the chamber at the first pressure and the first temperature to obtain the first magnetic susceptibility measurement. The first gas stream may include only the first gas compound such that the first magnetic susceptibility measurement is the magnetic susceptibility of a pure first gas compound at the first pressure and the first temperature. This may require purging the chamber of other fluids, including gases, heating the sorbent to desorb any fluids including gases, and/or setting the initial magnetic susceptibility of the sorbent to zero prior to directing the first gas stream into the chamber. The directing may be performed by admitting, feeding, introducing, flowing, or pumping the first gas stream into the chamber of the magnetic susceptibility device. The amount of the first gas stream directed into the chamber should be sufficient to bring at least the first gas compound from the first gas stream into contact with, or at least into immediate or close proximity to, the sorbent. Upon directing the first gas stream into the chamber, magnetic susceptibility may be monitored until sorption of the first gas compound by the sorbent reaches equilibrium. For example, in some embodiments, one or more magnetic susceptibility measurements of the first gas compound sorbed by the sorbent, at the first pressure and the first temperature, are taken and/or monitored until a value $\chi_1$ which is steady or about constant with time is obtained indicating gas sorption has reached equilibrium. In other words, in some embodiments, the first magnetic susceptibility measurement includes the magnetic susceptibility (e.g., with value $\chi_1$) of the sorbent in equilibrium with the first gas compound at the first pressure and the first temperature. In other embodiments, the first gas stream may include the first gas compound and one or more of inert gases, non-sorbing gases, and the like. In other further embodiments, the first magnetic susceptibility measurement may be obtained when sorption of the first gas compound by the sorbent is not at equilibrium, not at the first pressure, and/or not at the first temperature. In some embodiments, the first gas compound includes one or more of $H_2S$, $SO_2$, NO, $NO_2$, $CH_4$, $O_2$, and $N_2$, optionally one or more inert gases and/or carrier gases.

In step 106, the second gas stream including the second gas compound is directed into the chamber at the second pressure and the second temperature to obtain the second magnetic susceptibility measurement. The second gas stream may include only the second gas compound such that the second magnetic susceptibility measurement is the magnetic susceptibility of a pure second gas compound at the second pressure and the second temperature. This may require purging the chamber of other fluids, including gases, heating the sorbent to desorb any fluids including gases, and/or setting the initial magnetic susceptibility of the sorbent again to zero prior to directing the second gas stream into the chamber. The directing may be performed by admitting, feeding, introducing, flowing, or pumping the second gas stream into the chamber of the magnetic susceptibility device. The amount of the second gas stream directed into the chamber should be sufficient to bring at least the second gas compound from the second gas stream into contact with, or at least into immediate or close proximity to, the sorbent. Upon directing the second gas stream into the chamber, magnetic susceptibility may be monitored until sorption of the second gas compound by the sorbent reaches equilibrium. For example, in some embodiments, one or more magnetic susceptibility measurements of the second gas compound sorbed by the sorbent, at the second pressure and the second temperature, are taken and/or monitored until a value $\chi_2$ which is steady or about constant with time is obtained indicating gas sorption has reached equilibrium. In other words, in some embodiments, the second magnetic susceptibility measurement includes the magnetic susceptibility (e.g., with value $\chi_2$) of the sorbent in equilibrium with the second gas compound at the second pressure and the second temperature. In other embodiments, the second gas stream may include the second gas compound and one or more of inert gases, non-sorbing gases, and the like. In other further embodiments, the second magnetic susceptibility measurement may be obtained when sorption of the second gas compound by the sorbent is not at equilibrium, not at the second pressure, and/or not at the second temperature. In some embodiments, the second gas compound includes one or more of $H_2S$, $SO_2$, NO, $NO_2$, $CH_4$, $O_2$, and $N_2$, optionally one or more inert gases and/or carrier gases.

In step 108, the binary gas mixture including the first gas compound and the second gas compound is directed into the chamber at the third pressure (e.g., which may be the sum of the first pressure and the second pressure) and the third temperature (e.g., all temperatures during measurements may be the same) to obtain the third magnetic susceptibility measurement. In some embodiments, the third pressure is the sum of the first pressure and the second pressure (although other variations are possible and therefore within the scope of the present disclosure). In some embodiments, the third temperature is the same as and/or is similar to one or more of the first temperature and the second temperature. In some embodiments, the first temperature, the second temperature, and the third temperature are the same, or at least within about 5-10 degrees C. This may require purging the chamber of other fluids, including gases, heating the sorbent to desorb any fluids including gases and setting the initial magnetic susceptibility of the sorbent again to zero prior to directing the binary gas mixture stream into the chamber. The directing may be performed by admitting, feeding, introducing, flowing, or pumping the binary gas mixture into the chamber of the magnetic susceptibility device. The directing should be sufficient to bring at least the first gas compound and the second gas compound from the binary gas mixture into contact with, or at least into immediate or close proximity to, the sorbent. Upon directing the binary gas mixture into the chamber, magnetic susceptibility may be monitored until sorption of the first gas compound and/or second gas compound by the sorbent reaches equilibrium. For example, in some embodiments, one or more magnetic susceptibility measurements of the first gas compound and/or second gas compound sorbed by the sorbent, at the third pressure and the third temperature, are taken and/or monitored until a value $\chi_{1,2}$ which is steady or about constant with time is obtained indicating gas sorption has reached equilibrium. In other words, in some embodiments, the third magnetic susceptibility measurement includes the magnetic susceptibility (e.g., with value $\chi_{1,2}$) of the sorbent in equilibrium with the first gas compound and/or second gas compound at the third pressure and the third temperature. In other embodiments, the binary gas mixture may further include one or more of inert gases, non-sorbing gases, and the like. In other further embodiments, the third magnetic susceptibility measurement may be obtained when sorption of the first gas compound and/or second gas compound by the sorbent is not at equilibrium, not at the third pressure, and/or not at the third temperature. In some embodiments, the first gas compound and second gas compound independently include one or more of $H_2S$, $SO_2$, NO, $NO_2$, $CH_4$, $O_2$, and $N_2$, optionally one or more inert gases and/or carrier gases.

In step 110, a sorption separation factor is determined based on the first magnetic susceptibility measurement, the second magnetic susceptibility measurement, and the third magnetic susceptibility measurement. The separation factor, or real selectivity, may include the ratio of (a) the molar fraction of the first gas compound and the second gas compound in the sorbed phase (e.g., absorbed phase and/or adsorbed phase) and (b) the molar fraction of the first gas compound and the second gas compound in the gas phase (e.g., non-sorbed phase). Accordingly, the sorption separation factor may also interchangeably be referred to as one or more of the following: gas separation factor, real selectivity, adsorption selectivity, absorption selectivity, and the like. The magnetic susceptibility measurements of the sorbent-sorbate system may be used to derive the separation factor or real selectivity (e.g., see equation (3) below). For example, in some embodiments, the determination of the separation factor may involve utilization of equation (1), equation (2), and equation (3), which may be solved using, for example, the first magnetic susceptibility measurement, the second magnetic susceptibility measurement, and the third magnetic susceptibility measurement:

$$x_1 + x_2 = 1 \qquad (1)$$

$$x_1 \cdot \chi_1 + x_2 \cdot \chi_2 = \chi_{1,2} \qquad (2)$$

$$\text{Selectivity} = \frac{\frac{x_1}{x_2}}{\frac{y_1}{y_2}} \qquad (3)$$

where $x_1$ and $x_2$ are the molar fractions of the first gas compound and the second gas compound in the sorbed phase (e.g., an adsorbed phase and/or an absorbed phase), respectively;

where $y_1$ and $y_2$ are the molar fractions of the first gas compound and the second gas compound in the gas (e.g., non-sorbed) phase, respectively;

where $\chi_1$ is the first magnetic susceptibility measurement of the sorbent in equilibrium with the pure first gas compound at the first pressure and the first temperature;

where $\chi_2$ is the second magnetic susceptibility measurement of the sorbent in equilibrium with the pure second gas compound at the second pressure and the second temperature (e.g., which may be same as the first temperature); and where $\chi_{1,2}$ is the third magnetic susceptibility measurement of the sorbent in equilibrium with the binary gas mixture including the first gas compound and the second gas compound at the third pressure (which may be the sum of first and second pressures) and the third temperature (which may be the same as first and second temperature).

In some embodiments, equation (2) further includes the magnetic susceptibility of the sorbent material which may be obtained for example in step 102, after proper heat and/or vacuum assisted regeneration of the sorbent. In some embodiments, the magnetic susceptibility of the sorbent material is not included in equation (2) as shown because the magnetic susceptibility device used to monitor, measure, and/or obtain the magnetic susceptibility measurements may be tared, for example, after step 102, such that the magnetic susceptibility of the sorbent material need not be taken into account in determining the real selectivity in accordance with equation (2). For example, in some embodiments, such as after step 102, the magnetic susceptibility of the sorbent material may be set to a zero susceptibility level using a tare option of a magnetic susceptibility device and/or magnetic susceptibility meter.

While not wishing to be bound to a theory, it is believed that the magnetic susceptibility of a sorbate-sorbent system in which at least a first gas compound and/or a second gas compound has been sorbed (e.g., adsorbed and/or absorbed) by a sorbent (e.g., an adsorbent and/or an absorbent) changes linearly with the sorbed gas amount(s). Accordingly, it is believed that, for two sorbed gases (e.g., the sorbed first gas compound and the sorbed second gas compound), the magnetic susceptibility of the sorbent-sorbate system may be given by the rule of mixtures presented in equation (2) above. For example, as described above, the magnetic susceptibility of the sorbent-sorbate system in equilibrium with two pure gases (e.g., the first gas compound and the second gas compound), as well as a mixture of the two gases, may be measured and, once those measurements have been obtained, the sorption separation factor may be calculated by solving equation 1, equation 2, and equation 3. The device for determining the magnetic susceptibility of the adsorbent-adsorbate system may be any suitable device, such as a Gouy balance. In some embodiments, a device for determining magnetic susceptibility has been modified to allow equilibrium sorption of a gas by a sorbent under controlled pressure and/or controlled temperature, during magnetic susceptibility measurements.

Figure 2:
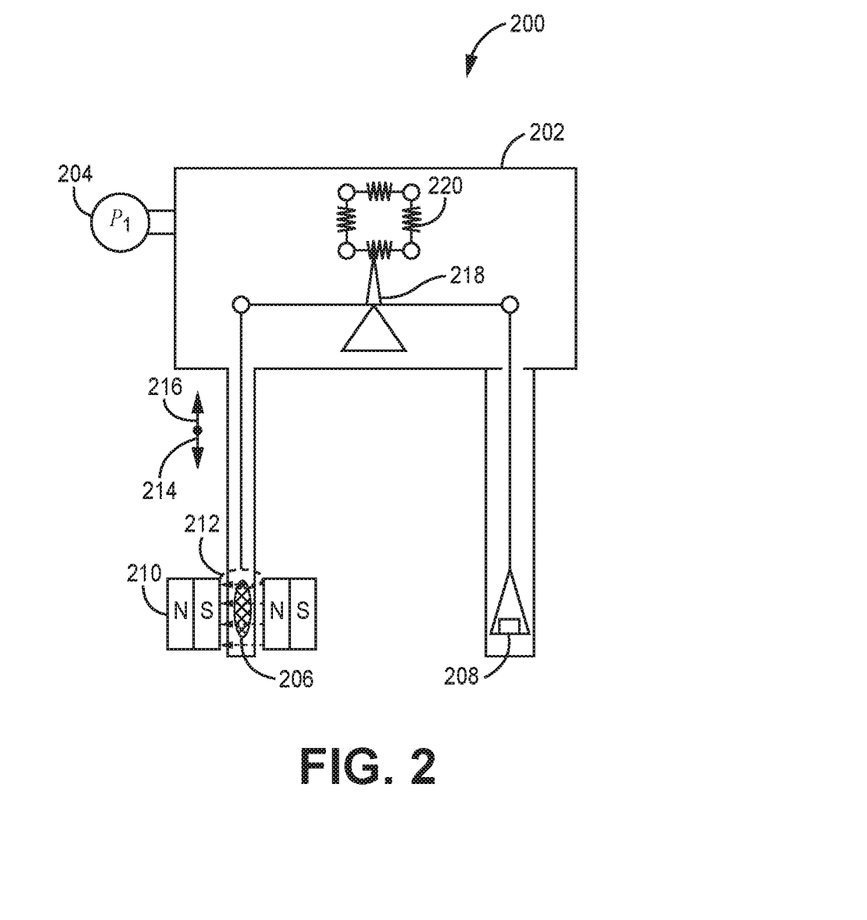
FIG. 2 is a schematic diagram of a gravimetric gas adsorption apparatus for measurement of adsorption isotherms under the influence of an inhomogeneous magnetic field, according to one or more embodiments of the invention.

That the magnetic susceptibility of the sorbent-sorbate system changes linearly with the sorbed gas amount may be experimentally examined and experimentally proven. FIG. 2 illustrates an experimental apparatus for collecting such data.

FIG. 2 shows a schematic diagram of gravimetric gas sorption apparatus 200, which includes balance 218 contained within housing 202. Balance 218 includes a holder for sample 206 and a holder for counterweight 208. Apparatus 200 also includes a plurality of magnets 210 positioned about the holder for sample 206. Plurality of magnets 210 produce an inhomogeneous magnetic field or magnetic gradient in gradient region 212 and the holder for sample 206 is located within or near gradient region 212. Apparatus 200 also includes pressure gauge 204 and heater 220 to enable the user or maintain a desired pressure and temperature within housing 202 during a testing procedure. In use, a sample (e.g., a sorption material) is placed in the holder for sample 206 and exposed to a fluid (e.g., oxygen or carbon dioxide gas). Balance 218 detects changes in the force produced by sample 206 as it sorbs the fluid and, optionally, is subjected to an inhomogeneous magnetic field by plurality of magnets 210. The inhomogeneous magnetic field can cause sample 206 and sorbed fluid to produce a paramagnetic force in direction 214 or a dia-magnetic force in direction 216, which balance 218 can detect as well.

Figure 3:
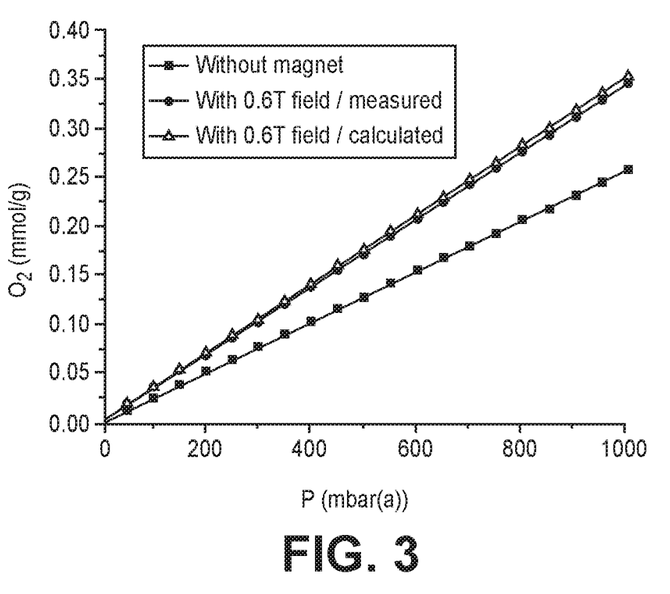
FIG. 3 is a graphical view of gravimetric adsorption isotherm of oxygen on activated carbon at 298 K as measured with and without the presence of a magnetic field, where the magnetic force, which is applied on the sorbent-sorbate system, makes the sample appear heavier (the lines labeled as "With 0.6 T field/measured" and "With 0.6 T field/calculated" vs. the line labeled "Without magnet"), has the direction of sample weight and increases linearly, as the amount of adsorbed oxygen (which is paramagnetic) also increases linearly, according to one or more embodiments of the invention.
Figure 4:
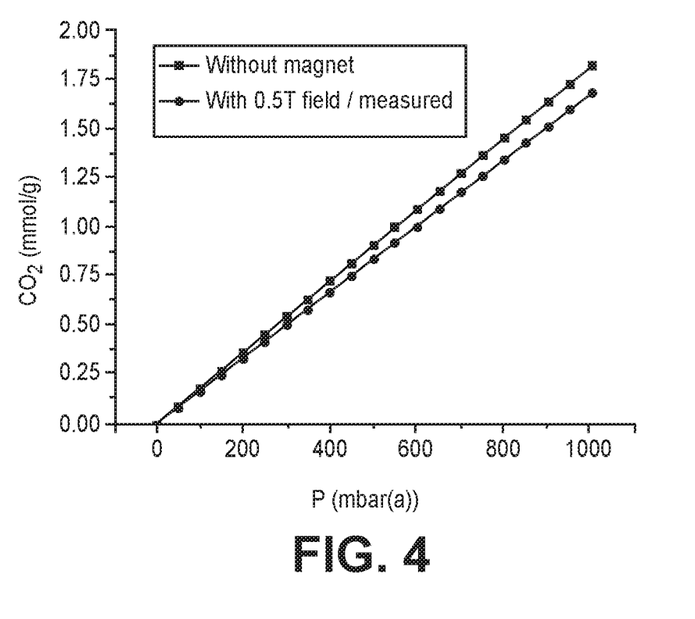
FIG. 4 is a graphical view of gravimetric adsorption isotherm of $CO_2$ on activated carbon at 298 K as measured with and without the presence of a magnetic field, where the magnetic force, which is applied on the adsorbent-adsorbate system, makes the sample appear lighter (the lower line labeled "With 0.5 T field/measured" vs. the upper line labeled "Without magnet"), has the direction against sample weight and increases linearly, as the amount of adsorbed $CO_2$ (which is diamagnetic) also increases linearly, according to one or more embodiments of the invention.

Apparatus 200 was used to collect data for oxygen adsorption isotherms on activated carbon by the gravimetric technique, with and without the presence of an inhomogeneous magnetic field, which has a constant product of magnetic flux density with the gradient of magnetic flux density ($\vec{B} \cdot \vec{\nabla B}$). The resulting data is shown in FIG. 3. It was found that, as pressure rises in the region of low pressures, where Henry's law applies (i.e., a linear correlation of adsorbed gas amount and pressure), the adsorbed gas amount increased linearly with pressure in the presence of an inhomogeneous magnetic field and in the absence of an inhomogeneous magnetic field. The different slope of the adsorbed amount versus pressure line was the result of the additional magnetic force, which was exerted on the adsorbent-adsorbate system when an inhomogeneous magnetic field was present. Since the magnetic force per unit volume is given by the equation $$\frac{\vec{F}}{V} = -\frac{\chi}{\mu} \cdot \vec{B} \cdot \vec{\nabla B}$$

and the product $\vec{B} \cdot \vec{\nabla B}$ remains constant, the magnetic force changed in direct analogy to magnetic susceptibility $\chi$ of the adsorbent-adsorbate system. Since the magnetic force (e.g., which corresponds to the vertical distance between line indicated as "Without magnet" and the line indicated as "With 0.6 T field/measured" in FIG. 3) was found to linearly increase with adsorbed gas amount (e.g., see the line indicated as "Without magnet" in FIG. 3), it emerged that magnetic susceptibility changed linearly with adsorbed gas amount. The same assumption was also proven for adsorption of other gases on the same sample, such as $CO_2$ (see FIG. 4).

Figure 5:
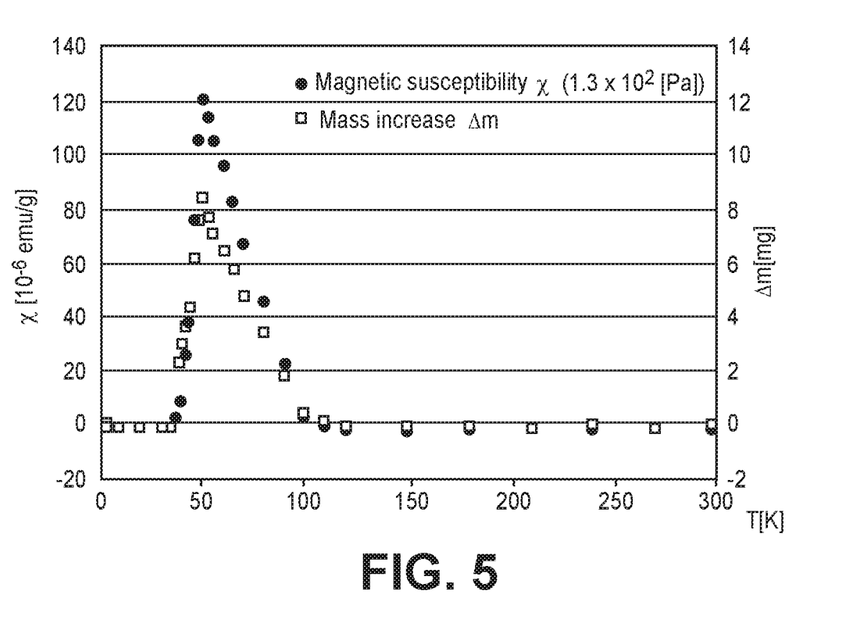
FIG. 5 is a graphical view of adsorbed oxygen amount (white squares) and magnetic susceptibility of activated carbon (black circles) at equilibrium with oxygen at 130 Pa pressure, demonstrating that magnetic susceptibility changes in direct analogy to adsorbed oxygen amount.

Accordingly, in some embodiments, a linear relationship exists between the magnetic susceptibility of the adsorbent-adsorbate system and the adsorbed gas amount. The magnetic susceptibility of activated carbon adsorbents in powder or granular form, at equilibrium with oxygen can also be measured to further support the existence of this linear relationship. For example, for pressures higher than a critical minimum pressure of 130 Pa, the molar magnetic susceptibility of adsorbed oxygen may remain constant with pressure and the magnetic susceptibility of the adsorbent-adsorbate system may change in direct analogy to adsorbed gas amount. See, for example, FIG. 5 which illustrates a plot graph of known data of adsorbed oxygen amount (white squares) and magnetic susceptibility of activated carbon (black circles) at equilibrium with oxygen at a pressure of 130 Pa. See, Kiyoshi Kawamura, et al., "Magnetic Susceptibility of Oxygen Absorbed on the Surface of Spherical and Fibrous Activated Carbon", Carbon—Sci. and Tech. 2(1), pg. 73-7 (February 2009). While equation (2) may be utilized for the adsorbed gas as component 1 and the carbon adsorbent as component 2, in some embodiments, magnetic susceptibility of the adsorbent may be ignored when utilizing magnetic susceptibility measuring instructions, such as Gouy microbalances, which have a tare feature that allows for zeroing out the magnetic susceptibility which can be applied initially to the bare, degassed adsorbent.

In some embodiments, a method for determining real adsorption selectivity (separation factor) of a gas adsorbent (or absorbent) of gas adsorption (or absorption) to a gas-adsorbing (or absorbing) material from a gas mixture with two compounds, which is characterized by the fact that the real adsorption selectivity is determined based on three magnetic susceptibility measurements (a, b, c) of the system containing the adsorbed (or absorbed) phase and the gas-adsorbing (or absorbing) material, during gas equilibrium adsorption (or absorption), namely: a first magnetic susceptibility measurement of pure first compound at gas pressure $y_1P$ and temperature T, a second magnetic susceptibility measurement of pure second compound at gas pressure $y_2P$ and temperature T, a third magnetic susceptibility measurement of the gas mixture of the two compounds at total gas pressure P and temperature T, wherein real selectivity of gas adsorption (or absorption) is defined as the ratio of molar fractions of the two gas compounds in the adsorbed (or absorbed) phase, divided by the ratio of molar fractions of the two gas compounds in the gaseous phase. Real selectivity of gas adsorption (or absorption) is then calculated by solving equations (1), (2), and (3):

$$x_1 + x_2 = 1 \tag{1}$$

$$x_1 \cdot \chi_1 + x_2 \cdot \chi_2 = \chi_{1,2} \tag{2}$$

$$\text{Selectivity} = \frac{\frac{x_1}{x_2}}{\frac{y_1}{y_2}} \tag{3}$$

where $x_1$, $x_2$ are molar fractions of the two gas mixture compounds 1 and 2 in the adsorbed (or absorbed phase;

where $y_1$, $y_2$ are the molar fraction of the two gas mixture compounds 1 and 2 in the gas phase;

where $\chi_1$ is the measured magnetic susceptibility of the adsorbent (or absorbent) material in equilibrium with pure gas 1 at pressure $y_1P$ and temperature T;

where $\chi_2$ is the measure magnetic susceptibility of the adsorbent (or absorbent) material in equilibrium with pure gas 2 at pressure $y_2P$ and temperature T; and where $\chi_{1,2}$ is the measured magnetic susceptibility of the adsorbent (or absorbent) material in equilibrium with mixture of gases 1 and 2 at pressure P and temperature T. In some embodiments, the magnetic susceptibility of the absorbent is neglected in equation (2) because it can be set to 'zero susceptibility level' by using the 'tare' option of the used magnetic susceptibility meter.

In some embodiments, a time- and cost-efficient method for determining real selectivity (i.e., separation factor) of gas adsorption to a gas-adsorbing material from a gas mixture including at least two gas compounds—namely, a first gas compound and a second gas compound—is provided, wherein the method is based on three magnetic susceptibility measurements of a gas adsorbing system containing an adsorbed phase and a gas-adsorbing material, during gas equilibrium adsorption, namely: a first magnetic susceptibility measurement of pure first gas compound at a first gas pressure $y_1P$ and a first temperature T, a second magnetic susceptibility measurement of pure second gas compound at a second gas pressure $y_2P$ and a second temperature T, and a third magnetic susceptibility measurement of the gas mixture including the first gas compound and the second gas compound at a third gas pressure P and a third temperature T (e.g., wherein the third gas pressure P is the total gas pressure of the two gas compounds). In some embodiments, the real selectivity of gas adsorption is defined as the ratio of molar fractions of the two gas compounds in the adsorbed phase, divided by the ratio of molar fractions of the two gas compounds in the gaseous phase. In some embodiments, the real selectivity of gas adsorption is then calculated by solving equations (1), (2), and (3):

$$x_1 + x_2 = 1 \tag{1}$$

$$x_1 \cdot \chi_1 + x_2 \cdot \chi_2 = \chi_{1,2} \tag{2}$$

$$\text{Selectivity} = \frac{\frac{x_1}{x_2}}{\frac{y_1}{y_2}} \tag{3}$$

where $x_1$, $x_2$ are the molar fractions of the first gas compound and the second gas compound in the adsorbed phase, respectively;

where $y_1$, $y_2$ are the molar fractions of the first gas compound and the second gas compound in the gas phase, respectively;

where $\chi_1$ is the measured magnetic susceptibility of the gas-adsorbing material in equilibrium with the pure first gas compound at the first gas pressure $y_1P$ and the first temperature;

where $\chi_2$ is the measured magnetic susceptibility of the gas-adsorbing material in equilibrium with the pure second gas compound at the second gas pressure $y_2P$ and the second temperature;

where $\chi_{1,2}$ is the measured magnetic susceptibility of the gas-adsorbing material in equilibrium with the mixture of the first gas compound and the second gas compound at the third pressure gas P and the third temperature T. In some embodiments, the magnetic susceptibility of the adsorbent is neglected in equation (2) because it can be set to 'zero susceptibility level' by using the 'tare' option of the used magnetic susceptibility meter.

In some embodiments, a time- and cost-efficient method for determining real selectivity (i.e., separation factor) of gas absorption to a gas-absorbing material from a gas mixture including at least two gas compounds—namely, a first gas compound and a second gas compound—is provided, wherein the method is based on three magnetic susceptibility measurements of a gas adsorbing system containing an absorbed phase and a gas-absorbing material, during gas equilibrium absorption, namely: a first magnetic susceptibility measurement of pure first gas compound at a first gas pressure $y_1P$ and a first temperature T, a second magnetic susceptibility measurement of pure second gas compound at a second gas pressure $y_2P$ and a second temperature T, and a third magnetic susceptibility measurement of the gas mixture including the first gas compound and the second gas compound at a third gas pressure P and a third temperature T (e.g., wherein the third gas pressure P is the total gas pressure of the two gas compounds). In some embodiments, the real selectivity of gas absorption is defined as the ratio of molar fractions of the two gas compounds in the absorbed phase, divided by the ratio of molar fractions of the two gas compounds in the gaseous phase. In some embodiments, the real selectivity of gas absorption is then calculated by solving equations (1), (2), and (3):

$$x_1 + x_2 = 1 \tag{1}$$

$$x_1 \cdot \chi_1 + x_2 \cdot \chi_2 = \chi_{1,2} \tag{2}$$

$$\text{Selectivity} = \frac{\frac{x_1}{x_2}}{\frac{y_1}{y_2}} \tag{3}$$

where $x_1$, $x_2$ are the molar fractions of the first gas compound and the second gas compound in the absorbed phase, respectively;

where $y_1$, $y_2$ are the molar fractions of the first gas compound and the second gas compound in the gas phase;

where $\chi_1$ is the measured magnetic susceptibility of the gas-absorbing material in equilibrium with the pure first gas compound at the first gas pressure $y_1 P$ and the first temperature;

where $\chi_2$ is the measured magnetic susceptibility of the gas-absorbing material in equilibrium with the pure second gas compound at the second gas pressure $y_2 P$ and the second temperature;

where $\chi_{1,2}$ is the measured magnetic susceptibility of the gas-absorbing material in equilibrium with the mixture of the first gas compound and the second gas compound at the third pressure gas P and the third temperature T. In some embodiments, the magnetic susceptibility of the absorbent is neglected in equation (2) because it can be set to 'zero susceptibility level' by using the 'tare' option of the used magnetic susceptibility meter.

The apparatus for determining the magnetic susceptibility of the sorbent-sorbate system may include any suitable device. Examples of devices suitable for measuring magnetic susceptibility according to the present invention include, without limitation, Gouy balances, Sherwood Scientific MSB MK1 and/or AUTO instruments (both MK1 and Auto work based on stationary sample and moving magnets), and the like. In some embodiments, the magnetic susceptibility measuring devices may be subjected to one or more modifications to allow equilibrium adsorption of a gas to a sorbent (e.g., an absorbent and/or an adsorbent) under controlled pressure and/or temperature, during magnetic susceptibility measurements.

Figure 6:
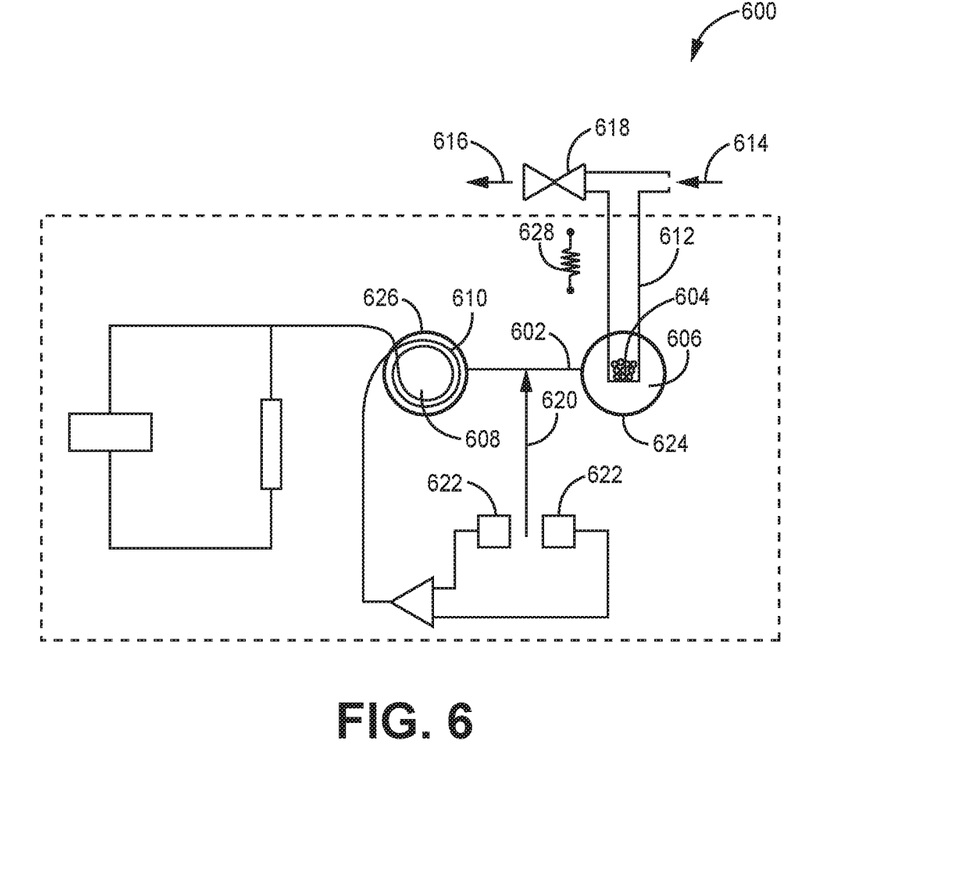
FIG. 6 is a schematic diagram of a magnetic susceptibility device including a micro-balance for measuring magnetic susceptibility of an adsorbent in equilibrium with a gas stream (once for each pure gas and once for the mixture of the two) at controlled pressure and temperature, according to one or more embodiments of the invention.

FIG. 6 is a schematic diagram of a magnetic susceptibility device and system 600 useful for practicing some embodiments of the inventive methods. System 600 includes balance 602 for measuring the magnetic susceptibility of sorbent 604 when it is in equilibrium with a gas stream at controlled pressure and temperature, according to one or more embodiments of the invention.

Balance 602 of magnetic susceptibility system 600 includes first end 606 and second end 608. System 600 also includes at least two sets of magnets, with a first pair of magnets 624 positioned about or near first end 606 and a second pair of magnets 626 positioned about or near second end 608. Magnets 624 positioned about or near first end 606 are configured to subject first end 606 to a magnetic field (e.g., an inhomogeneous magnetic field). Similarly, magnets 626 positioned about or near second end 608 are configured to subject second end 608 to a magnetic field (e.g., an inhomogeneous magnetic field). Second end 608 includes coil 610, with coil 610 disposed between magnets 626 arranged about or near first end 608 and within their magnetic field. First end 606 is configured to accept a sample such that the sample is disposed between magnets 624 arranged about or near first end 606 and within their magnetic field.

System 600 also include flow cell 612 which is in fluid communication with gas inlet 614 and gas outlet 616. Sorbent 604 is positioned within flow cell 612 and can be a solid or liquid adsorbent, a solid or liquid absorbent, or combinations thereof. For example, sorbent 604 can be a solid powder. Flow cell 612 is positioned such that all or some of sorbent 604 is disposed in the sample area of balance 602 on or near first end 606 of balance 602 and sorbent 604 is partially or completely within a magnetic field that could be generated by magnets 624 about or near first end 606. Sorbent 604 is in fluid communication with gas inlet 614 and gas outlet 616. Valve 618 (e.g., a back pressure regulator valve) is provided for controlling and/or regulating gas pressure to maintain a desired amount of gas flowing through system 600 and ensuring that sorbent 604 remains exposed to the flowing gas. System 600 also includes a heater 628 configured to heat a gas within flow cell 612 to keep the gas at a predetermined temperature.

System 600 also includes movable balance rod 620, which extends from balance 602 and is moveable between at least two optical sensors 622. Introducing a sample into the magnetic field produced by magnets 624 about or near first end 606 can cause balance rod to deflect or otherwise move and such movement can be detected by optical sensors 622.

System 600 is used to measure the magnetic susceptibility of a sample such as sorbent 604 in flow cell 612. A low continuous gas flow may enter system 600 through gas inlet 614 and be maintained through flow cell 612 in such a way that sorbent 604 remains in place while sorbent 604 and the gas reach equilibrium. For example, in some embodiments, a gas stream of a pure first gas compound, at a regulated first pressure $y_1 P$ and a first temperature T, is directed into flow cell 612 and the magnetic susceptibility of sorbent 604 is monitored until a value $\chi_1$, that is stable with time, is reached when gas adsorption has come to equilibrium. A gas stream of a pure second gas compound, at a regulated second pressure $y_2 P$ and a second temperature T, is directed into flow cell 612 and the magnetic susceptibility of sorbent 604 is monitored until a value $\chi_2$, that is stable with time, is reached when gas adsorption has come to equilibrium. A gas stream including a binary gas mixture of the first gas compound and the second gas compound with molar fractions $y_2$ and $y_2$, at a regulated third pressure P and a third temperature T, is directed into flow cell 612 and the magnetic susceptibility of sorbent 604 is monitored until a value $\chi_{1,2}$, that is stable with time, is reached when gas adsorption has come to equilibrium. The real gas sorption selectivity (e.g., separation factor) is then determined by solving equation 1, equation 2, and equation 3.

In some embodiments, the magnetic susceptibility device includes the gravimetric gas sorption apparatus presented in FIG. 2. In some embodiments, the gravimetric gas sorption apparatus has been modified to permit equilibrium sorption of a gas by a sorbent under controlled pressure and/or controlled temperature during magnetic susceptibility measurements. In some embodiments, the magnetic susceptibility device includes a volumetric gas sorption apparatus. In some embodiments, the volumetric gas sorption apparatus has been modified to permit equilibrium sorption of a gas by a sorbent under controlled pressure and/or controlled temperature during magnetic susceptibility measurements. In some embodiments, the magnetic susceptibility device includes a volumetric-gravimetric gas sorption apparatus. In some embodiments, the volumetric-gravimetric gas sorption apparatus has been modified to permit equilibrium sorption of a gas by a sorbent under controlled pressure and/or controlled temperature during magnetic susceptibility measurements.

What is claimed is:

1. A method of determining a sorption separation factor for a binary gas mixture, the method comprising:
   applying a magnetic field to at least a portion of a sorbent disposed in a chamber of a magnetic susceptibility device;
   directing a first gas stream including a first gas compound into the chamber at a first pressure and a first temperature to obtain a first magnetic susceptibility measurement;
   directing a second gas stream including a second gas compound into the chamber at a second pressure and a second temperature to obtain a second magnetic susceptibility measurement;
   directing a binary gas mixture including the first gas compound and the second gas compound into the chamber at a third pressure and a third temperature to obtain a third magnetic susceptibility measurement; and
   determining the sorption separation factor based on the first magnetic susceptibility measurement, the second magnetic susceptibility measurement, and the third magnetic susceptibility measurement.

2. The method according to claim 1, wherein the magnetic field that is applied to the at least a portion of a sorbent includes an inhomogeneous magnetic field.

3. The method according to claim 1, wherein the sorbent includes at least one of an adsorbent material and an absorbent material and wherein if the sorbent is an adsorbent material then the sorption separation factor is a gas adsorption separation factor and wherein if the sorbent is an absorbent material then the sorption separation factor is a gas absorbent separation factor.

4. The method according to claim 1, wherein the first magnetic susceptibility measurement is obtained after sorption of the first gas compound by the sorbent has reached equilibrium.

5. The method according to claim 1, wherein the second magnetic susceptibility measurement is obtained after sorption of the second gas compound by the sorbent has reached equilibrium.

6. The method according to claim 1, wherein the third magnetic susceptibility measurement is obtained after sorption by the sorbent of the first gas compound and the second gas compound of the binary gas mixture has reached equilibrium.

7. The method according to claim 1, wherein magnetic susceptibility of the at least a portion of a sorbent is monitored prior to obtaining the first magnetic susceptibility measurement, the second magnetic susceptibility measurement, and the third magnetic susceptibility measurement.

8. The method according to claim 1, wherein the sorbent adsorbs or absorbs the first gas compound and the second gas compound.

9. The method according to claim 1, wherein the first temperature, the second temperature, and the third temperature are the same temperature.

10. The method according to claim 1, wherein the third pressure is the sum of the partial pressures of the first and the second gas compounds in the binary gas mixture and wherein the first pressure is equal to the partial pressure of the first gas component in the binary gas mixture and the second pressure is equal to the partial pressure of the second gas component in the binary gas mixture.

11. The method according to claim 1, wherein the sorption separation factor is determined by solving equations (1) to (3):

$$x_1 + x_2 = 1 \quad (1)$$

$$x_1 \cdot \chi_1 + x_2 \cdot \chi_2 = \chi_{1,2} \quad (2)$$

$$\text{Selectivity} = \frac{\frac{x_1}{x_2}}{\frac{y_1}{y_2}} \quad (3)$$

where $x_1$ and $x_2$ are the molar fractions of the first gas compound and the second gas compound in the sorbed phase, respectively; where $y_1$ and $y_2$ are the molar fractions of the first gas compound and the second gas compound in the gas phase, respectively; where $\chi_1$ is the first magnetic susceptibility measurement of the sorbent in equilibrium with the pure first gas compound at the first pressure and the first temperature; where $\chi_2$ is the second magnetic susceptibility measurement of the sorbent in equilibrium with the pure second gas compound at the second pressure and the second temperature; and where $\chi_{1,2}$ is the third magnetic susceptibility measurement of the sorbent in equilibrium with the binary gas mixture including the first gas compound and the second gas compound at the third pressure and the third temperature.

12. The method according to claim 1, wherein the sorbent disposed in the chamber is a gas adsorbing sample and wherein the magnetic susceptibility device is configured to allow for gas adsorption to the gas adsorbing sample while controlling gas pressure and temperature inside the chamber and while magnetic susceptibility is measured for the gas adsorbing sample.

13. The method according to claim 1, wherein the magnetic susceptibility device includes a gravimetric device and the gravimetric device is used to measure magnetic susceptibility.

14. The method according to claim 1, wherein the magnetic susceptibility device includes a volumetric device and the volumetric device is used is used to measure magnetic susceptibility.

15. The method according to claim 1, wherein the magnetic susceptibility device includes a volumetric-gravimetric device and the volumetric-gravimetric device is used to measure magnetic susceptibility.

16. A system for determining a sorption separation factor for a binary gas mixture, the system comprising:
   a sorbent;
   a balance for measuring the magnetic susceptibility of the sorbent;
   a flow cell, wherein the sorbent is contained within the flow cell;
   at least one pair of magnets disposed about the sorbent in the flow cell, the magnets configured to produce a magnetic field around the sorbent in the flow cell;
   a gas inlet in fluid communication with the sorbent in the flow cell; and
   a gas outlet in fluid communication with the sorbent in the flow cell.

17. The system of claim 16, further including at least one valve configured to control the pressure of a gas within the flow cell.

18. The system of claim 16, wherein the system further includes a heater configured to control the temperature of a gas in the flow cell.

19. The system of claim 16, further including a rod attached to the balance, wherein movement by the balance causes the rod to move.

20. The system of claim 19, wherein the system further includes an optical sensor configured to detect movement by the rod.

* * * * *